(12) United States Patent
Jarrett-Amor et al.

(10) Patent No.: US 12,587,173 B2
(45) Date of Patent: Mar. 24, 2026

(54) SIGNAL TRANSCEIVER, DIE AND DEVICE

(71) Applicants: Huawei Technologies Canada Co., Ltd., Kanata (CA); The Governing Council of the University of Toronto, Toronto (CA)

(72) Inventors: Durand Philippe Jarrett-Amor, Toronto (CA); Anthony Chan Carusone, Burlington (CA); Mohammad Sadegh Jalali, Ajax (CA)

(73) Assignees: HUAWEI TECHNOLOGIES CANADA CO., LTD., Kanata (CA); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 18/637,228

(22) Filed: Apr. 16, 2024

(65) Prior Publication Data

US 2025/0323628 A1 Oct. 16, 2025

(51) Int. Cl.
*H03H 11/04* (2006.01)

(52) U.S. Cl.
CPC .................................. *H03H 11/04* (2013.01)

(58) Field of Classification Search
None
See application file for complete search history.

(56) References Cited

U.S. PATENT DOCUMENTS

| | | | | |
|---|---|---|---|---|
| 10,033,419 B1 * | 7/2018 | Chong | ..................... | H04B 1/16 |
| 2024/0348285 A1 * | 10/2024 | Gupta | ................... | H04B 3/487 |

OTHER PUBLICATIONS

Durand Jarrett-Amor et. al., "A 32Gb/s 0.42 pJ/bit Passive Hybrid Simultaneous Bidirectional Transceiver for Die-to-Die Links," Oct. 27, 2023, total 5 pages.
Yoshinori Nishi et. al., "A 0.297-pJ/bit 50.4-GB/s/wire Inverter-Based Short-Reach Simultaneous Bidirectional Transceiver for Die-to-Die Interface in 5nm CMOS," 2022 IEEE Symposium on VLSI Technology and Circuits (VLSI Technology and Circuits), Jun. 12-17, 2022, total 2 pages.

(Continued)

*Primary Examiner* — Jeffrey S Zweizig
(74) *Attorney, Agent, or Firm* — Slater Matsil, LLP

(57) ABSTRACT

A signal transceiver includes a driver, an interference removal circuit and a split-termination resistor. The interference removal circuit includes a first passive circuit and a second passive circuit. The interference removal circuit has a first port connected to an output terminal of the driver, for receiving an outbound signal output by the driver. The interference removal circuit has a second port used to output the outbound signal and receive an inbound signal. The interference removal circuit has a third port and a fourth port that are used to output a recovery signal, where the recovery signal is the inbound signal after an interference caused by the outbound signal removed by the first passive circuit and the second passive circuit. The split-termination resistor is connected between the first port and the second port. The first passive circuit is connected between the first port and the third port, and the second passive circuit is connected between the second port and the fourth port.

20 Claims, 4 Drawing Sheets

(56)     References Cited

OTHER PUBLICATIONS

Yasumoto Tomita et. al., "A 20-GB/s Simultaneous Bidirectional Transceiver Using a Resistor-Transconductor Hybrid in 0.11-μm CMOS," IEEE Journal of Solid-State Circuits, vol. 42, No. 3, Mar. 2007, total 10 pages.

Chen Yuan et. al., "On the Design of Low-Power Hybrids for Full Duplex Simultaneous Bidirectional Signaling Links," IEEE Transactions on Circuits and Systems I: Regular Papers, vol. 67, Issue: 4, Apr. 2020, total 10 pages.

* cited by examiner

SIGNAL TRANSCEIVER, DIE AND DEVICE

TECHNICAL FIELD

The present disclosure relates to the field of integrated circuits, and in particular, to a signal transceiver, a die, and a device.

BACKGROUND

In the application scenarios of D2D (Die-to-Die) communication, the same die or different dies from the same vendor or different dies from various vendors, are encapsulated in the same integrated circuit package and communicate with each other via D2D links. In the die as shown in FIG. 1, GPUs (Graphics Processing Units) can communicate with each other via D2D links, GPUs can also communicate with memory (stacked DRAM (Dynamic Random Access Memory)) via D2D links, and GPUs can also communicate with GPUs of other dies via input/output ports (I/O) of the dies.

In D2D links, signals are transmitted in an SBD (Simultaneous bidirectional) mode. While sending an outbound signal, a signal transceiver within a die (such as a GPU), also receives an inbound signal sent by other dies. As a result, the outbound signal interferes with the inbound signal, thereby generating an echo signal that affects the reception quality of the inbound signal. Therefore, in D2D links in the SBD mode, it is desired to remove the echo signal in signal transceivers caused by the interference of the outbound signal on the inbound signal.

SUMMARY

In an aspect, a signal transceiver is provided. The signal transceiver includes a driver, an interference removal circuit and a split-termination resistor. The interference removal circuit includes a first passive circuit and a second passive circuit. The interference removal circuit has a first port connected to an output terminal of the driver, for receiving an outbound signal output by the driver. The interference removal circuit has a second port used to output the outbound signal and receive an inbound signal. The interference removal circuit has a third port and a fourth port that are used to output a recovery signal, where the recovery signal is the inbound signal after an interference caused by the outbound signal removed by the first passive circuit and the second passive circuit. The split-termination resistor is connected between the first port and the second port. The first passive circuit is connected between the first port and the third port, and the second passive circuit is connected between the second port and the fourth port.

In some embodiments, the first passive circuit includes a first component module and a second component module, and the second passive circuit includes a third component module and a fourth component module. The first component module is connected between the first port and the third port, and the first component module includes a first adjustable capacitor and a first series circuit connected in parallel with the first adjustable capacitor. The first series circuit includes a first adjustable resistor and a first capacitor that are connected in series. The second component module is connected between the third port and a ground of the first passive circuit, and the second component module includes a second adjustable capacitor and a second series circuit connected in parallel with the second adjustable capacitor. The second series circuit includes a second adjustable resistor and a second capacitor that are connected in series. The third component module is connected between the second port and the fourth port, and the third component module includes a third adjustable capacitor and a third series circuit connected in parallel with the third adjustable capacitor. The third series circuit includes a third adjustable resistor and a third capacitor that are connected in series. The fourth component module is connected between the fourth port and a ground of the second passive circuit, and the fourth component module includes a fourth adjustable capacitor and a fourth series circuit connected in parallel with the fourth adjustable capacitor. The fourth series circuit includes a fourth adjustable resistor and a fourth capacitor that are connected in series.

In some embodiments, the first component module and the second component module are connected to a common-mode voltage source through an adjustable resistor, and the third component module and the fourth component module are connected to the common-mode voltage source through another adjustable resistor.

In some embodiments, a signal transfer function of the first passive circuit and a signal transfer function of the second passive circuit satisfy:

$$H_2(s) = H_1(s)\left(1 + \frac{R_{sp}}{Z_T}\right);$$

where $H_2(s)$ is the signal transfer function of the second passive circuit, $H_1(s)$ is the signal transfer function of the first passive circuit, $R_{sp}$ is a resistance value of the split-termination resistor, and $Z_T$ is a sum of an output impedance value of the driver and a resistance value of the split-termination resistor.

In some embodiments, a signal transfer function of the first passive circuit is one that maximizes the worst-case eye height of the recovery signal in a case where a high-level signal is sent to the signal transceiver.

In some embodiments, a resistance value of the output resistor of the signal driver is greater than a resistance value of the split-termination resistor.

In some embodiments, the driver includes a pre-driver, an output driver, and a programmable feedback resistor. A signal output terminal of the pre-driver is connected to a signal input terminal of the output driver, and the programmable feedback resistor is connected between the signal input terminal and a signal output terminal of the output driver. The output driver includes a complementary metal-oxide semiconductor (CMOS) inverter, and an output impedance of the output driver is equal to a reciprocal of transconductance of the CMOS inverter. The pre-driver is used to output a current signal to the output driver, and the output driver is used to convert the current signal into a voltage signal as the outbound signal for output.

In some embodiments, a sum of an output impedance of the driver and a resistance value of the split-termination resistor is equal to a value of characteristic impedance of a transmission line connected to the second port.

In another aspect, a die is provided. The die includes at least one signal transceiver as described in any one of the preceding embodiments.

In yet another aspect, a device is provided, including at least two dies as described in the preceding embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings.

DETAILED DESCRIPTION OF ILLUSTRATIVE EMBODIMENTS

In order to understand the embodiments of the present disclosure more clearly, some terms or technologies involved in the embodiments of the present disclosure are described below.

SBD, Simultaneous bidirectional, refers to how a channel is used when communicating data over the channel. In SBD signaling, data is transmitted and received simultaneously, at the same or different data-rates, over the same channel.

D2D, Die-to-Die, refers to how two or more dies from the same (different) vendor(s) are physically connected together (linked) in order to transfer data between the die (e.g., a CPU (Central Processing Unit) die and a memory die, or a logic die and an analog die, etc.). D2D links involve two dies connected together within the same package, as opposed to chip-to-chip communication where two or more dies in separate packages are connected together via a printed circuit board.

ESD, Electrostatic Discharge protection circuit, is a type of circuit that is used to protect the core circuits within a package from ESD events during handling and assembly of the package onto a board, as well as during regular operation of the assembled system.

TIA, Transimpedance Amplifier, is a current-to-voltage converter that converts an input current to an output voltage through an amplifier with a feedback resistor.

CMOS, Complementary Metal-Oxide Semiconductor, is a type of MOSFET (Metal-Oxide Semiconductor Field-Effect Transistor) fabrication process that uses complementary p-type and n-type MOSFETs for building integrated circuits.

pMOS, a p-type metal-oxide semiconductor field-effect transistor, is a type of transistor that is created by doping silicon with an electron acceptor during fabrication, where the term "p-type" comes from the fact that an electron acceptor dopant creates a positive hole where the electron used to be.

nMOS, an n-type metal-oxide semiconductor field-effect transistor is a type of transistor that is created by doping silicon with an electron donor during fabrication, where the term "n-type" comes from the fact that an electron donor dopant creates a negative charge by donating an electron to silicon.

In D2D links in the SBD mode, it is desired to remove the echo signal in signal transceivers caused by the interference of the outbound signal on the inbound signal.

Figure 1:
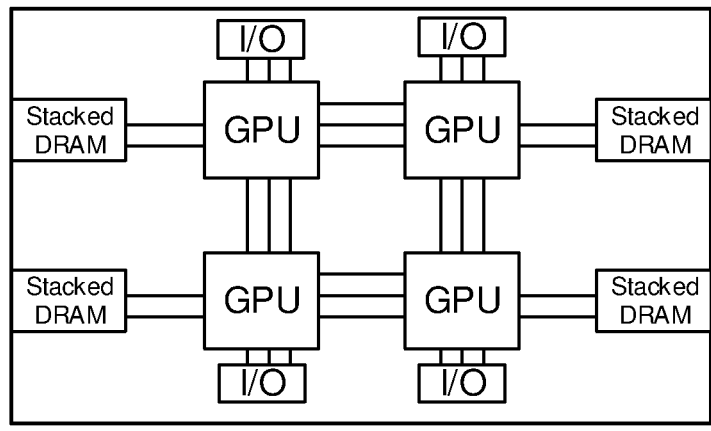
FIG. 1 is a schematic diagram showing a structure of a chip including a plurality of dies.
Figure 2:
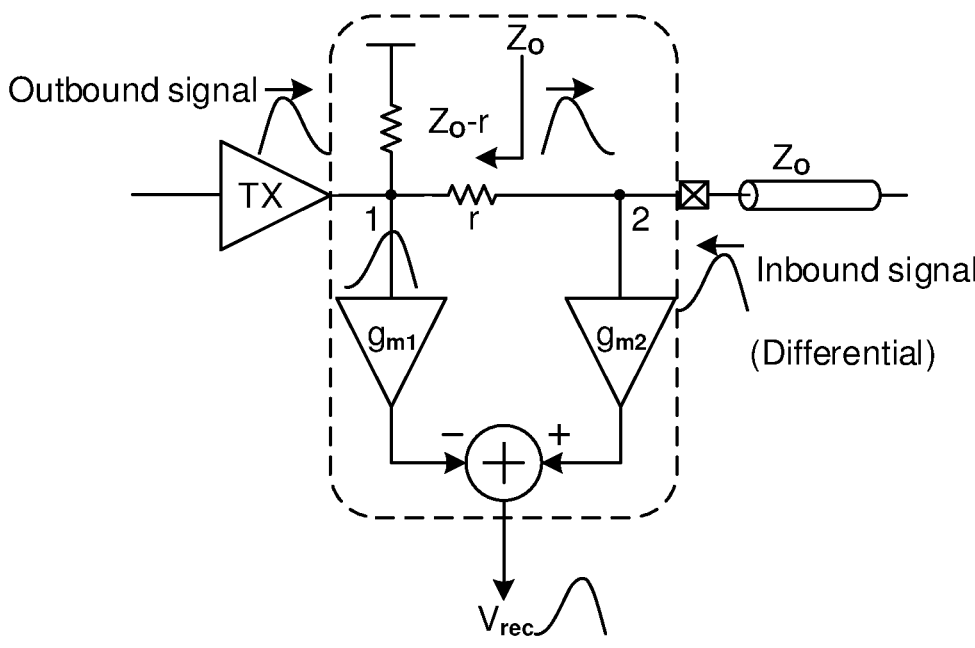
FIG. 2 is a schematic diagram showing a method.

In a split-termination R (Resistor)-$g_m$ (transconductance) hybrid circuit as shown in FIG. 2, the current-mode split-termination and weighted $g_m$ method are employed to remove the echo signal in SBD communication mode. The split termination R-$g_m$ hybrid circuit is connected to a transmission line with a characteristic impedance of $Z_O$. A resistor r is utilized to create two circuit nodes: node 1 and node 2, and an extra resistor with a resistance value of $Z_O$-r is added between the node 1 and the ground of the circuit to ensure that the circuit's impedance is matched. The circuit is assumed to split the outbound signal from a driver between the node 1 and the node 2. The voltage signals at the node 1 and the node 2 are then pass through two different $g_m$ circuits ($g_{m1}$ and $g_{m2}$), where they are each multiplied by a respective $g_m$ weight, converted to a current, and then subtracted from each other to remove the outbound signal at the output of the R-$g_m$ hybrid circuit. The echo signal generated by the interference of the outbound signal on the inbound signal is thus removed. Upon entering the split-termination R-$g_m$ hybrid circuit, the inbound signal also passes through two different $g_m$ circuits and then output as a recovery signal $V_{rec}$.

The above method has the advantage of removing the outbound signal without using an extra driver circuit block, thus saving on area as well as avoiding any gain/timing issues that would be present in a case of using a copy of a master driver circuit block to remove the outbound signal, and it uses continuous-time signal recovery.

However, in the split-termination R (Resistor)-$g_m$ circuit (hybrid) as shown in FIG. 2, a signal-dependent nonlinearity caused by the use of the $g_m$ circuits will degrade the effectiveness of removing the outbound signal or echo signal (as well as the recovery of the inbound signal). Furthermore, the removal of the outbound signal (the echo signal) and the recovery of the inbound signal depend on a precise matching of parameters between the two $g_m$ circuits. Achieving the precise matching of the parameters between the two $g_m$ circuits serving as active circuits poses significant challenges; and since both $g_m$ circuits are active circuits, they require power to operate, which generates an extra power consumption. This extra power consumption is a drawback for D2D links because power consumption is an important design constraint.

Figure 3:
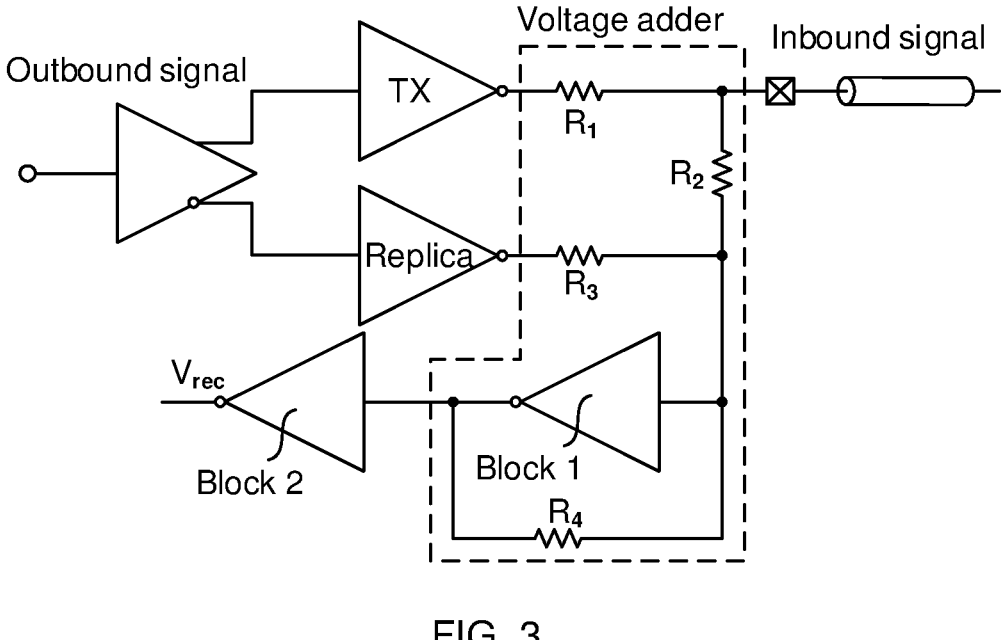
FIG. 3 is a schematic diagram showing another method.

In a circuit employing an inverter as a replica driver as shown in FIG. 3, the inverter in voltage-mode is used to remove outbound signals in SBD signaling. In the SBD mode as shown in FIG. 3, the outbound signal is output from this circuit while the inbound signal is input into it. To remove such outbound signals in SBD signaling, the above method used a voltage adder, whereby an output signal of a TX block (driver block) passes through resistors $R_1$, $R_2$, and $R_4$, whereas an output signal of a replica block (replica driver block) passes through resistors $R_3$ and $R_4$. The output signals of the TX and replica blocks are added together at an output of $R_4$, where they are cancelled (assuming correct weighting of the resistor values $R_1$ to $R_4$). This is because the output signal of the replica block is the inverted version of the output signal of the TX block. The inbound signal is divided by $R_2$ and, after passing through two inverters (block 1 and block 2) in FIG. 3, is output as the recovery signal $V_{rec}$.

The above method has the advantage of simple design, uses continuous-time signal recovery, and is implemented using CMOS inverters in the TX and replica blocks, which is easily scalable to advanced nodes.

However, the termination of the link in FIG. 3 depends on the output resistances of the TX block, the replica block, and the resistors in the voltage adder circuit, making it difficult to provide a constant termination for reducing signal reflections firstly, posing a challenge. Secondly, resistors $R_1$ and $R_2$ are directly bonded to the chip pads, thus forming part of the ESD protection circuit. As a result, values of resistors $R_1$ and $R_2$ are constrained by ESD protection rules, making resistors $R_1$ and $R_2$ difficult to be programmable. This implies that the values of resistors $R_1$ and $R_2$ will vary with process, voltage, and temperature changes, leading to variations in the effectiveness of removing the outbound signal (the echo signal). Thirdly, the replica block takes up extra area and consumes extra power, which is a drawback for D2D links.

Figure 4:
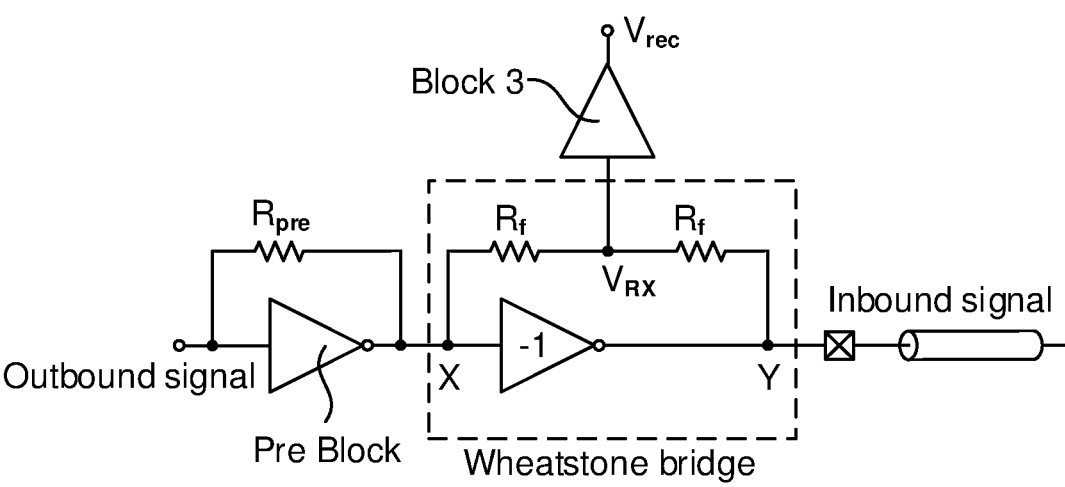
FIG. 4 is a schematic diagram showing yet another method.

As shown in FIG. 4, in the circuit utilizing a pre-driver as the replica driver, there exists a pre-driver (pre block) with a feedback resistor $R_{pre}$ connected in parallel at a node X. An output signal of this pre-driver (the outbound signal) is transmitted to a node $V_{RX}$, and then to a node Y through a master driver (−1 block) as a way of achieving the removal of this output signal. As sending from the nodes X to Y, the output signal of the pre-driver is inverted during this process. Then, the inverted signal at the node Y is transmitted to the node $V_{RX}$ in a Wheatstone bridge (consisting of one −1 block and two resistors $R_f$), where it is added together with the non-inverted signal from the node X and, consequently, canceled out. The inbound signal passes through the node Y, one $R_f$ in the Wheatstone bridge and the node $V_{RX}$, and is output as the recovery signal $V_{rec}$ through an inverter (block 3).

However, the cancelation of the outbound signal depends on the precise matching of the transconductance ($g_m$) between the pre-driver and the master driver in the above method, and the removal of the outbound signal requires that the delay of the inverter of the master driver is sufficiently small to ensure that the delay from the nodes X to Y in FIG. 4 is almost zero. Thus, the delay of the inverter limits the achievable data rates of this method. Moreover, the pre-driver in this prior art will interfere with the recovery of the inbound signal at the $V_{RX}$ node, thereby attenuating the recovery signal $V_{rec}$.

The three methods depicted in FIGS. 2 to 4 illustrate the challenges faced in removing the interference from the outbound signal in D2D links in the current SBD mode. Among these three methods, the circuit's part for removing the interference from the outbound signal utilizes active components, leading to signal-dependent nonlinearity and relatively high power consumption.

In light of this, embodiments of the present disclosure provide a signal transceiver, a die and a semiconductor device to overcome the challenges above.

The signal transceiver differs from that of the methods depicted in FIGS. 2 to 4, aimed at removing the echo signal caused by the interference of the outbound signal on the inbound signal.

Figure 5:
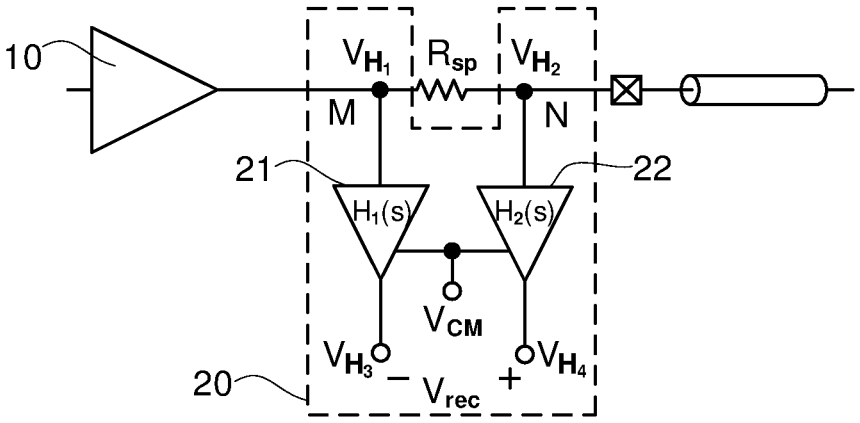
FIG. 5 is a schematic diagram showing a structure of a signal transceiver in some embodiments of the present disclosure.

As shown in FIG. 5, the signal transceiver is provided within a die, for receiving an inbound signal and transmitting an outbound signal to another die through a transmission line. The signal transceiver includes a driver 10 and an interference removal circuit 20, in which the interference removal circuit 20 includes a first passive circuit 21 and a second passive circuit 22. A first port $V_{H_1}$ of the interference removal circuit 20 is connected to an output terminal of the driver 10, for receiving an outbound signal output by the driver 10, a second port $V_{H_2}$ of the interference removal circuit 20 is used to output the outbound signal and receive an inbound signal, and a third port $V_{H_3}$ and a fourth port $V_{H_4}$ of the interference removal circuit 20 are used to output a recovery signal, where the recovery signal is the inbound signal after the interference caused by the outbound signal has been removed by the first passive circuit 21 and the second passive circuit 22. The signal transceiver further includes a split-termination resistor $R_{sp}$, which is connected between the first port $V_{H_1}$ and the second port $V_{H_2}$. The first passive circuit is connected between the first port $V_{H_1}$ and the third port $V_{H_3}$, and the second passive circuit is connected between the second port $V_{H_2}$ and the fourth port $V_{H_4}$.

The driver 10 that not only converts current signals to voltage signals for output but also provides its own output impedance for termination, ensuring impedance matching in circuits of the signal transceiver.

The output port of the driver 10 is connected to the first port $V_{H_1}$ of the interference removal circuit 20, and the second port $V_{H_2}$ of the interference removal circuit 20 is used to be connected to a transmission line for communication with other dies. Outbound signals that do not require passing through the interference removal circuit 20, split from the outbound signals output by the driver 10, are directed to other dies through the second port $V_{H_2}$. Between the first port $V_{H_1}$ and the second port $V_{H_2}$, there exists a split-termination resistor $R_{sp}$, which not only provides the termination resistance required by the link but also creates two nodes: a node M and a node N.

In a circuit, nodes are locations or endpoints that each connect different parts of the circuit. The generation of a new node implies the introduction of a new connection point, providing new opportunities and branches in the circuit, thereby enabling the interference removal circuit 20 to function properly.

The interference removal circuit 20 splits the outbound signal from the driver 10 between the nodes M and N. The voltage signals at the nodes M and N then pass through the first passive circuit 21 and the second passive circuit 22 that constitute the interference removal circuit 20. The voltage signal passing through the first passive circuit 21 and the voltage signal passing through the second passive circuit 22 are outputted in a differential mode, removing the outbound signal, i.e., removing the echo signal caused by the interference of the outbound signal on the inbound signal. Simultaneously, upon entering the signal transceiver, the inbound signal also passes through the first passive circuit 21 and the second passive circuit 22. The third port $V_{H_3}$ and the fourth port $V_{H_4}$ of the interference removal circuit 20 output a recovery signal $V_{rec}$ in a differential mode (output in hybrid). In this way, the inbound signal, having had the interference from the outbound signal removed by the interference removal circuit 20, enters the die.

Figure 6:
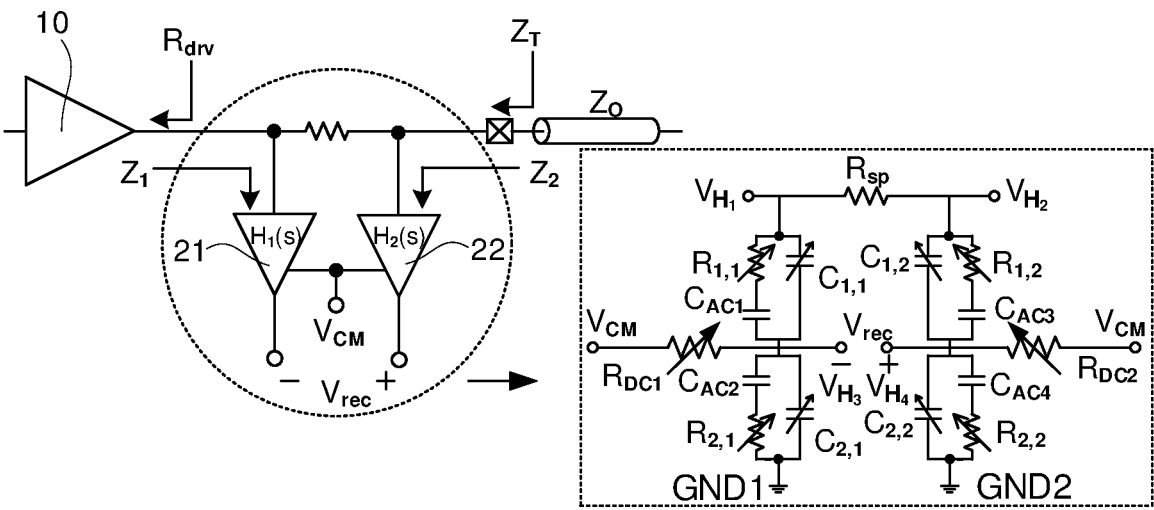
FIG. 6 is a schematic diagram showing a structure of a signal transceiver in some other embodiments of the present disclosure.

As shown in FIG. 6, the first passive circuit 21 includes a first component module and a second component module. The first component module is connected between the first port $V_{H_1}$ and the third port $V_{H_3}$, and the second component module is connected between the third port $V_{H_3}$ and a ground GND1 of the first passive circuit 21.

The first component module includes a first adjustable capacitor $C_{1,1}$, and a first series circuit connected in parallel with the first adjustable capacitor $C_{1,1}$. The first series circuit includes a first adjustable resistor $R_{1,1}$ and a first capacitor $C_{AC1}$ that are connected in series.

The second component module includes a second adjustable capacitor $C_{2,1}$, and a second series circuit connected in parallel with the second adjustable capacitor $C_{2,1}$. The second series circuit includes a second adjustable resistor $R_{2,1}$ and a second capacitor $C_{AC2}$ that are connected in series.

The second passive circuit 22 includes a third component module and a fourth component module. The third component module is connected between the second port $V_{H_2}$ and the fourth port $V_{H_4}$, and the fourth component module is connected between the fourth port $V_{H_4}$ and a ground GND2 of the second passive circuit 22.

The third component module includes a third adjustable capacitor $C_{1,2}$, and a third series circuit connected in parallel with the third adjustable capacitor $C_{1,2}$. The third series circuit includes a third adjustable resistor $R_{1,2}$ and a third capacitor $C_{AC3}$ that are connected in series.

The fourth component module includes a fourth adjustable capacitor $C_{2,2}$, and a fourth series circuit connected in parallel with the fourth adjustable capacitor. The fourth series circuit includes a fourth adjustable resistor $R_{2,2}$ and a fourth capacitor $C_{AC4}$ that are connected in series.

As can be seen, both the first passive circuit 21 and the second passive circuit 22 are composed of passive components such as resistors and capacitors. Embodiments of the present disclosure utilize parameters of passive components to improve matching among process, voltage, and temperature variations for removing the echo signal. Since the parameters of passive components are easier to control, the sensitivity of the signal transceiver can be enhanced. Furthermore, as the interference removal circuit 20 is composed entirely of passive components, signal-dependent nonlinearity can be reduced as well as the power consumption of the circuit.

The echo signal output from the third port $V_{H_3}$ and the fourth port $V_{H_4}$ in hybrid can be expressed by the following equation:

$$V_{echo}(s) = \left( H_2(s) - H_1(s) \left( 1 + \frac{R_{sp}}{Z_T} \right) \right) V_{ob}(s); \qquad (1)$$

where $V_{echo}(s)$ represents the echo signal; $H_2(s)$ represents a signal transfer function of the second passive circuit 22; $H_1(s)$ represents a signal transfer function of the first passive circuit 21; $Z_T$ represents a value of the termination impedance of the link, and typically, $Z_T$ is equal to a value $Z_O$ of characteristic impedance of the transmission line connected to the second port $V_{H_2}$ to ensure impedance matching of the link; $R_{sp}$ represents a value of the resistance of the split-termination resistor $R_{sp}$; $V_{ob}(s)$ represents the outbound signal; and s denotes a complex variable by Laplace transform, expressing the frequency of signals.

$H_1(s)$ and $H_2(s)$ are determined by the parameter ratio between the various passive components in the interference removal circuit 20. Under low-frequency conditions, $H_1(s)$ and $H_2(s)$ can expressed by the following equations:

$$H_1(s \to 0) = \frac{R_{2,1}}{R_{1,1} + R_{2,1}} = H_{1_{DC}}; \qquad (2)$$

$$H_2(s \to 0) = \frac{R_{2,2}}{R_{1,2} + R_{2,2}} = H_{2_{DC}}; \qquad (3)$$

where $H_{1_{DC}}$ is the transfer function of the first passive circuit 21 at low frequency, and $H_{2_{DC}}$ is the transfer function of the second passive circuit 22 at low frequency.

Under high-frequency conditions, capacitance magnitudes of the first capacitor $C_{AC1}$, the second capacitor $C_{AC2}$, the third capacitor $C_{AC3}$, and the fourth capacitor $C_{AC4}$ are designed to be capacitance magnitudes that block low-frequency signals and allow high-frequency signals to pass therethrough. When a signal is transmitted at a high frequency, the first capacitor $C_{AC1}$, the second capacitor $C_{AC2}$, the third capacitor $C_{AC3}$, and the fourth capacitor $C_{AC4}$ generate low impedance, making branches in which they are located may be regarded as short circuits. In this case the capacitors $C_{1,1}$, $C_{1,2}$, $C_{2,1}$, and $C_{2,2}$ act like short circuits (or low impedance nodes), so, $H_1(s)$ and $H_2(s)$ can be expressed by the following equations:

$$H_1(s \to \infty) = \frac{C_{1,1}}{C_{1,1} + C_{2,1}} = H_{1_{AC}}; \qquad (4)$$

$$H_2(s \to \infty) = \frac{C_{1,2}}{C_{1,2} + C_{2,2}} = H_{2_{AC}}; \qquad (5)$$

where $H_{1_{AC}}$ is the transfer function of the first passive circuit 21 at high frequency, and $H_{2_{AC}}$ is the transfer function of the second passive circuit 22 at high frequency.

The first component module and the second component module are connected to a common-mode voltage source $V_{CM}$ via an adjustable resistor $R_{DC1}$, and the third component module and the fourth component module are connected to the common-mode voltage source $V_{CM}$ via another adjustable resistor $R_{DC2}$.

The common-mode voltage source $V_{CM}$ is used to provide a reference level to ensure the proper operation of the first passive circuit 21 and the second passive circuit 22. The common-mode voltage source $V_{CM}$ is used to cancel out common-mode interference on signals input to the first passive circuit 21 and the second passive circuit 22, thereby enhancing the immunity of the two passive circuits to interference.

An adjustable resistor $R_{DC1}$ is connected between the common-mode voltage source $V_{CM}$ and the first passive circuit 21 and an adjustable resistor $R_{DC2}$ is connected between the common-mode voltage source $V_{CM}$ and the second passive circuit 22, serving to adjust a common-mode voltage from the common-mode voltage source $V_{CM}$. The adjustable resistors adjust a value of the common-mode voltage to adapt to different application scenarios or requirements.

Specifically, the adjustable resistors $R_{DC1}$ and $R_{DC2}$ can be used to adjust the level of the voltage output from the common-mode voltage source $V_{CM}$ to match the operating requirements of the first passive circuit 21 and the second passive circuit 22. By adjusting the resistance values of the adjustable resistors $R_{DC1}$ and $R_{DC2}$, the voltage output from the common-mode voltage source $V_{CM}$ can be adjusted, thereby controlling the degree to which the first passive circuit 21 and the second passive circuit 22 suppress the common-mode interference and the range of signal processing by the two passive circuits.

During the parameter design of the various passive components in the interference removal circuit 20, tuning and design adjustments need to be performed according to the value of the split-termination resistor $R_{sp}$. The relationship between the split-termination resistor $R_{sp}$ and the recovery signal $V_{rec}(s)$ can be expressed by the following equation:

$$V_{rec}(s) = \frac{R_{sp}}{Z_O} H_1 V_{ib}(s); \tag{6}$$

where $V_{ib}(s)$ represents the inbound signal.

As can be seen in Equation (6), it is evident that during the parameter design and tuning process of the interference removal circuit 20, as the split-termination resistor $R_{sp}$ decreases, the recovery signal $V_{rec}(s)$ also decreases accordingly. To counteract the reduction in the recovery signal, $H_1$ can be increased. However, there is a certain limit to how much $H_1$ can be increased. Therefore, to find the optimal value of $H_1$, peak distortion analysis can be conducted to maximize the worst-case eye height of the recovery signal $v_{rec}$ when sending a "1" (high-level signal) to the signal transceiver under worst-case conditions, as shown in the following equation:

$$\max_{H_1}\{v_{rec}(t, H_1)\} = \tag{7}$$

$$\max_{H_1}\left\{v_{rec,0}(H_1) - \left(\sum_{k=-\infty,k\neq0}^{\infty} |v_k(H_1)| + \sum_{k=-\infty}^{\infty} |v_{echo,k}(H_1)|\right)\right\};$$

where $V_{rec}(t, H_1)$ is the function of the recovery signal $v_{rec}$ with respect to time t and $H_1$; $V_{rec,0}(H_1)$ is the amplitude of $v_{rec}$ outputting a "1" signal without any distortion, which is also a function of $H_1$;

$$\sum_{k=-\infty,k\neq0}^{\infty} |v_k(H_1)|$$

represents the total sum of the amplitudes of all non-zero frequency components $v_k$, which is also a function of $H_1$; and $$\sum_{k=-\infty}^{\infty} |v_{echo,k}(H_1)|$$

represents the total sum of the amplitudes of all frequency components $v_{echo,k}$ of the echo signal.

As can be seen in Equation (7), the left side of the equal sign represents the calculation performed using data obtained from the peak distortion analysis. The $H_1$ that needs to be found in this calculation is represented by the right side of the equal sign, which aims to maximize the worst-case eye height of the recovery signal $v_{rec}$.

It can be understood that the specific parameters and scenarios corresponding to the "worst-case" adopted during the peak distortion analysis can be adaptively adjusted and selected according to the specific design requirements of the signal transceiver circuit.

Once $H_1$ is determined, to ensure complete removal of the echo signal $v_{echo}$, $H_2$ can be determined using the following equation:

$$H_2 = H_1\left(1 + \frac{R_{sp}}{Z_T}\right). \tag{8}$$

Typically, to ensure impedance matching of the link, $Z_T$ is equal to the value $Z_O$ of the characteristic impedance of the transmission line connected to the second port $V_{H_2}$.

The following settings may be selected for simplicity: $H_{1_{DC}}=H_{1_{AC}}=H_1$ and $H_{2_{DC}}=H_{2_{AC}}=H_2$.

In summary, the parameters of each passive component in the interference removal circuit 20 can be determined through equations (2) to (8). This also establishes the ratio of passive component parameters in the interference removal circuit 20 to remove the echo signal. As the ratio of passive component parameters is more controllable, the sensitivity of the signal transceiver can be enhanced. Additionally, since all components in the interference removal circuit 20 are passive, the signal-related nonlinearity issues are reduced and the power consumption is decreased.

Figure 7:
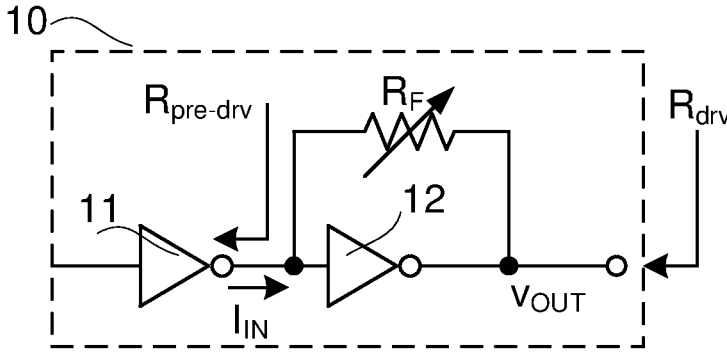
FIG. 7 is a schematic diagram showing a structure of a driver in some embodiments of the present disclosure.

As shown in FIG. 7, the driver 10 in the signal transceiver may be a TIA (transimpedance amplifier) voltage-mode driver. This TIA voltage-mode driver includes a pre-driver 11, an output driver 12, and a programmable feedback resistor $R_F$. A signal output terminal of the pre-driver 11 is connected to a signal input terminal of the output driver 12, and the programmable feedback resistor $R_F$ is connected between the signal input and output terminals of the output driver 12.

The pre-driver 11 provides a current signal $I_{IN}$ to the output driver 12, and the output driver 12 converts this current signal $I_{IN}$ into a voltage signal $V_{OUT}$ for output to the interference removal circuit 20 using the programmable feedback resistor $R_F$. This conversion occurs because, according to Ohm's law, a voltage is generated when a current passes through a resistor. By providing an appropriate feedback resistor $R_F$, the output current can be converted into a desired voltage signal.

The use of the TIA voltage mode driver with a feedback resistor $R_F$ helps to keep the output impedance of the driver 10 relatively constant during a signal conversion of outbound signal, thereby reducing signal reflections due to impedance mismatches on the link.

The output driver 12 includes a CMOS inverter. During the design process, it can be assumed that the transconductance of a pMOS transistor in this CMOS inverter is equal to the transconductance of an nMOS transistor in the CMOS inverter (both are $g_m$). Thus, the transconductance of the CMOS inverter may be approximated as $2 g_m$, and the small-signal output impedance $R_{drv}$ of the driver 10 (from low to medium frequencies) can be expressed as the following equation:

$$R_{drv} \approx \frac{1}{2g_m}. \tag{9}$$

Of course, in the design process calculation, Equation (9) can be directly simplified to the following equation:

$$R_{drv} = \frac{1}{2g_m}. \tag{10}$$

The premise for equations (9) and (10) to hold is that the output impedance $R_{pre-drv}$ of the pre-driver 11 is much larger than $R_F$, $R_{pre-drv}>>R_F$. This is because, if $R_{pre-drv}>>R_F$, then a negligible amount of current will be able to flow from the output terminal of the output driver 12 through the feedback resistor $R_F$, and into the output resistance of the pre-driver 11. As a result, the output impedance of the output driver 12 can be approximately regarded as the reciprocal of the transconductance of the CMOS inverter.

In a CMOS inverter, size of a transistors is usually affected by the transconductance value. If smaller transconductance values are chosen for the nMOS and pMOS transistors, a lower power consumption in the CMOS inverter can be achieved. Since power consumption is related to the size and operating voltage of the transistors, choosing smaller transconductance values for the transistors typically allows for the design of smaller-sized CMOS inverters, achieving a good balance between the power consumption and performance. It can be seen that CMOS inverters with small transconductance values can reduce the power consumption and area of the output driver 12.

According to Equation (10), a larger $R_{drv}$ can result in a smaller $g_m$. The relationship between $R_{drv}$ and the $R_{sp}$ can be expressed by the following equation:

$$Z_T = R_{drv} + R_{sp}. \tag{11}$$

It can be understood that Equation (11) holds under the assumption that the input impedance $Z_1$ of the first passive circuit 21 and the input impedance $Z_2$ of the second passive circuit 22 are both much greater than $Z_T$, that is, the effects of $Z_1$ and $Z_2$ on the termination are not considered.

Typically, to ensure impedance matching of the link, $Z_T$ is equal to the value $Z_O$ of the characteristic impedance of the transmission line connected to the second port $V_{H_2}$.

According to Equation (11), after determining the value $R_{sp}$ of the split-termination resistor $R_{sp}$, the selected $R_{drv}$ satisfies $R_{sp} < R_{drv}$, to determine a value of a small $g_m$, thereby reducing the power consumption and area of the output driver 12.

Moreover, reducing the area of the output driver 12 also reduces the power consumption of the pre-driver 11, as the capacitance in the output driver 12 driven by the pre-driver 11 decreases.

In addition to the transconductance of the CMOS inverter, the feedback resistor $R_F$ also affects the bandwidth, gain, and power consumption design of the driver 10. Therefore, using a programmable feedback resistor as the feedback resistor $R_F$ enables programmable gain and bandwidth. Moreover, the speed and swing of the output driver 12 can be increased or decreased by adjusting the programmable feedback resistor $R_F$. Additionally, since the power consumption of the pre-driver 11 is inversely proportional to $R_F$ and directly proportional to the output swing of the output driver 12, the programmable feedback resistor $R_F$ can be adjusted to have a large resistance value to reduce the power consumption of the pre-driver 11 and increase the swing of the output driver 12.

As depicted in FIGS. 6 and 7, the signal transceiver utilizes the interference removal circuit 20 composed of passive components to reduce signal-related nonlinearity issues and decrease power consumption. Additionally, by adjusting the ratio of passive component parameters, better echo signal removal can be achieved across process, voltage, and temperature variations. Since the parameters of the passive components are more controllable, the sensitivity of the signal transceiver is enhanced. Furthermore, the use of the TIA voltage mode driver with a feedback resistor helps to keep the output impedance of the driver relatively constant during a signal conversion of outbound signal, thereby reducing signal reflections due to impedance mismatches on the link. The TIA driver can also assist in lowering the power consumption and area of the signal transceiver by employing a CMOS inverter with small transconductance value.

With the signal transceiver provided in embodiments of the present disclosure, the performance of the D2D link can be more balanced. For example, if a 16 nm CMOS process is used and the supply voltage is 0.9 V, the speed can reach 32 Gbps/wire, the power consumption can reach 0.42 pJ/bit, the pin efficiency is 200%, the area is 0.137 mm$^2$, the channel length is 5 mm, and the channel loss is less than 1 dB.

The signal transceiver described in the above embodiments is located within a die. The present disclosure further provides a die including at least one signal transceiver as described in the above embodiments. The die may be a general-purpose processor core (such as ARM, x86), a specialized processor core (such as GPU, TPU), a memory core, or a specialized integrated circuit (ASIC, 5G baseband). The present disclosure does not limit the specific functionality of the die.

The present disclosure further provides a semiconductor device provided therein with at least one D2D link, and the semiconductor device includes at least two dies as described in the above embodiments. For any two dies in this semiconductor device, communication in SBD mode is performed using the signal transceiver described in the above embodiments.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A signal transceiver, comprising:
a driver;
an interference removal circuit, including a first passive circuit and a second passive circuit, wherein
   the interference removal circuit has a first port connected to an output terminal of the driver, for receiving an outbound signal output by the driver;
   the interference removal circuit has a second port used to output the outbound signal and receive an inbound signal; and
   the interference removal circuit has a third port and a fourth port that are used to output a recovery signal, wherein the recovery signal is the inbound signal after an interference caused by the outbound signal is removed by the first passive circuit and the second passive circuit, wherein
   the first passive circuit is connected between the first port and the third port, and the second passive circuit is connected between the second port and the fourth port; and
a split-termination resistor, connected between the first port and the second port.

2. The signal transceiver according to claim 1, wherein the first passive circuit includes a first component module and a second component module, wherein
   the first component module is connected between the first port and the third port, and the first component module includes a first adjustable capacitor and a first series circuit connected in parallel with the first adjustable capacitor; the first series circuit includes a first adjustable resistor and a first capacitor that are connected in series; and the second component module is connected between the third port and a ground of the first passive circuit, and the second component module includes a second adjustable capacitor and a second series circuit connected in parallel with the second adjustable capacitor; the second series circuit includes a second adjustable resistor and a second capacitor that are connected in series; and the second passive circuit includes a third component module and a fourth component module, wherein the third component module is connected between the second port and the fourth port, and the third component module includes a third adjustable capacitor and a third series circuit connected in parallel with the third adjustable capacitor; the third series circuit includes a third adjustable resistor and a third capacitor that are connected in series; and the fourth component module is connected between the fourth port and a ground of the second passive circuit, and the fourth component module includes a fourth adjustable capacitor and a fourth series circuit connected in parallel with the fourth adjustable capacitor; the fourth series circuit includes a fourth adjustable resistor and a fourth capacitor that are connected in series.

3. The signal transceiver according to claim 2, wherein the first component module and the second component module are connected to a common-mode voltage source through an adjustable resistor, and the third component module and the fourth component module are connected to the common-mode voltage source through another adjustable resistor.

4. The signal transceiver according to claim 1, wherein a signal transfer function of the first passive circuit and a signal transfer function of the second passive circuit satisfy:

$$H_2(s) = H_1(s)\left(1 + \frac{R_{sp}}{Z_T}\right);$$

wherein $H_2(s)$ is the signal transfer function of the second passive circuit, $H_1(s)$ is the signal transfer function of the first passive circuit, $R_{sp}$ is a resistance value of the split-termination resistor, and $Z_T$ is a sum of an output impedance value of the driver and the resistance value of the split-termination resistor.

5. The signal transceiver according to claim 1, wherein a signal transfer function of the first passive circuit is one that maximizes a worst-case eye height of the recovery signal in a case where a high-level signal is sent to the signal transceiver.

6. The signal transceiver according to claim 1, wherein a resistance value of an output resistor of the driver is greater than a resistance value of the split-termination resistor.

7. The signal transceiver according to claim 1, wherein the driver includes a pre-driver, an output driver, and a programmable feedback resistor, wherein a signal output terminal of the pre-driver is connected to a signal input terminal of the output driver, and the programmable feedback resistor is connected between the signal input terminal and a signal output terminal of the output driver;

the output driver includes a complementary metal-oxide semiconductor (CMOS) inverter, and an output impedance of the output driver is equal to a reciprocal of transconductance of the CMOS inverter; and the pre-driver is used to output a current signal to the output driver, and the output driver is used to convert the current signal into a voltage signal as the outbound signal for output.

8. The signal transceiver according to claim 1, wherein a sum of an output impedance of the driver and a resistance value of the split-termination resistor is equal to a value of characteristic impedance of a transmission line connected to the second port.

9. A die, comprising at least one signal transceiver, each signal transceiver of the at least one signal transceiver including:

a driver;

an interference removal circuit, including a first passive circuit and a second passive circuit, wherein the interference removal circuit has a first port connected to an output terminal of the driver, for receiving an outbound signal output by the driver;

the interference removal circuit has a second port used to output the outbound signal and receive an inbound signal; and the interference removal circuit has a third port and a fourth port that are used to output a recovery signal, wherein the recovery signal is the inbound signal after an interference caused by the outbound signal is removed by the first passive circuit and the second passive circuit, wherein the first passive circuit is connected between the first port and the third port, and the second passive circuit is connected between the second port and the fourth port; and a split-termination resistor, connected between the first port and the second port.

10. The die according to claim 9, wherein the first passive circuit includes a first component module and a second component module, wherein the first component module is connected between the first port and the third port, and the first component module includes a first adjustable capacitor and a first series circuit connected in parallel with the first adjustable capacitor; the first series circuit includes a first adjustable resistor and a first capacitor that are connected in series; and the second component module is connected between the third port and a ground of the first passive circuit, and the second component module includes a second adjustable capacitor and a second series circuit connected in parallel with the second adjustable capacitor; the second series circuit includes a second adjustable resistor and a second capacitor that are connected in series; and the second passive circuit includes a third component module and a fourth component module, wherein the third component module is connected between the second port and the fourth port, and the third component module includes a third adjustable capacitor and a third series circuit connected in parallel with the third adjustable capacitor; the third series circuit includes a third adjustable resistor and a third capacitor that are connected in series; and the fourth component module is connected between the fourth port and a ground of the second passive circuit, and the fourth component module includes a fourth adjustable capacitor and a fourth series circuit connected in parallel with the fourth adjustable capacitor; the fourth series circuit includes a fourth adjustable resistor and a fourth capacitor that are connected in series.

11. The die according to claim 10, wherein the first component module and the second component module are connected to a common-mode voltage source through an adjustable resistor, and the third component module and the fourth component module are connected to the common-mode voltage source through another adjustable resistor.

12. The die according to claim 9, wherein a signal transfer function of the first passive circuit and a signal transfer function of the second passive circuit satisfy:

$$H_2(s)=H_1(s)(1+R_{sp}/Z_T)$$

wherein $H_2(s)$ is the signal transfer function of the second passive circuit, $H_1(s)$ is the signal transfer function of the first passive circuit, $R_{sp}$ is a resistance value of the split-termination resistor, and $Z_T$ is a sum of an output impedance value of the driver and the resistance value of the split-termination resistor.

13. The die according to claim 9, wherein a signal transfer function of the first passive circuit is one that maximizes a worst-case eye height of the recovery signal in a case where a high-level signal is sent to the signal transceiver.

14. The die according to claim 9, wherein a resistance value of an output resistor of the driver is greater than a resistance value of the split-termination resistor.

15. A semiconductor device, comprising at least two dies, each die of the at least two dies comprising at least one corresponding signal transceiver, each signal transceiver of the at least one corresponding signal transceiver including:

a driver;

an interference removal circuit, including a first passive circuit and a second passive circuit, wherein the interference removal circuit has a first port connected to an output terminal of the driver, for receiving an outbound signal output by the driver;

the interference removal circuit has a second port used to output the outbound signal and receive an inbound signal; and the interference removal circuit has a third port and a fourth port that are used to output a recovery signal, wherein the recovery signal is the inbound signal after an interference caused by the outbound signal is removed by the first passive circuit and the second passive circuit, wherein the first passive circuit is connected between the first port and the third port, and the second passive circuit is connected between the second port and the fourth port; and a split-termination resistor, connected between the first port and the second port.

16. The semiconductor device according to claim 15, wherein the first passive circuit includes a first component module and a second component module, wherein the first component module is connected between the first port and the third port, and the first component module includes a first adjustable capacitor and a first series circuit connected in parallel with the first adjustable capacitor; the first series circuit includes a first adjustable resistor and a first capacitor that are connected in series; and the second component module is connected between the third port and a ground of the first passive circuit, and the second component module includes a second adjustable capacitor and a second series circuit connected in parallel with the second adjustable capacitor; the second series circuit includes a second adjustable resistor and a second capacitor that are connected in series; and the second passive circuit includes a third component module and a fourth component module, wherein the third component module is connected between the second port and the fourth port, and the third component module includes a third adjustable capacitor and a third series circuit connected in parallel with the third adjustable capacitor; the third series circuit includes a third adjustable resistor and a third capacitor that are connected in series; and the fourth component module is connected between the fourth port and a ground of the second passive circuit, and the fourth component module includes a fourth adjustable capacitor and a fourth series circuit connected in parallel with the fourth adjustable capacitor; the fourth series circuit includes a fourth adjustable resistor and a fourth capacitor that are connected in series.

17. The semiconductor device according to claim 16, wherein the first component module and the second component module are connected to a common-mode voltage source through an adjustable resistor, and the third component module and the fourth component module are connected to the common-mode voltage source through another adjustable resistor.

18. The semiconductor device according to claim 15, wherein a signal transfer function of the first passive circuit and a signal transfer function of the second passive circuit satisfy:

$$H_2(s)=H_1(s)(1+R_{sp}/Z_T);$$

wherein $H_2(s)$ is the signal transfer function of the second passive circuit, $H_1(s)$ is the signal transfer function of the first passive circuit, $R_{sp}$ is a resistance value of the split-termination resistor, and $Z_T$ is a sum of an output impedance value of the driver and the resistance value of the split-termination resistor.

19. The semiconductor device according to claim 15, wherein a signal transfer function of the first passive circuit is one that maximizes a worst-case eye height of the recovery signal in a case where a high-level signal is sent to the signal transceiver.

20. The semiconductor device according to claim 15, wherein a resistance value of an output resistor of the driver is greater than a resistance value of the split-termination resistor.

* * * * *